US010492293B2

(12) United States Patent
Park et al.

(10) Patent No.: US 10,492,293 B2
(45) Date of Patent: Nov. 26, 2019

(54) DISPLAY APPARATUS (71) Applicant: Samsung Display Co., Ltd., Yongin (KR)

(72) Inventors: Jaechun Park, Yongin (KR); Yunho Kim, Yongin (KR); Jeongseok Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 135 days.

(21) Appl. No.: 14/638,641

(22) Filed: Mar. 4, 2015

(65) Prior Publication Data

US 2016/0066461 A1 Mar. 3, 2016

(30) Foreign Application Priority Data

Sep. 3, 2014 (KR) .................. 10-2014-0117024

(51) Int. Cl.
| | | |
|---|---|---|
| H05K 1/02 | (2006.01) | |
| H05K 7/20 | (2006.01) | |
| G02F 1/1333 | (2006.01) | |
| H05K 1/14 | (2006.01) | |
| G02F 1/1345 | (2006.01) | |

(52) U.S. Cl.
CPC ....... *H05K 1/028* (2013.01); *G02F 1/133382* (2013.01); *H05K 7/20463* (2013.01); *H05K 7/20963* (2013.01); *G02F 1/13454* (2013.01); *G02F 2001/133331* (2013.01); *G02F 2202/28* (2013.01); *H05K 1/147* (2013.01); *H05K 2201/10128* (2013.01)

(58) Field of Classification Search
CPC .. H05K 1/028; H05K 1/0281; H05K 7/20463; H05K 7/20963; G02F 1/13
USPC .......................................................... 345/173
See application file for complete search history.

(56) References Cited

U.S. PATENT DOCUMENTS

| | | | | |
|---|---|---|---|---|
| 6,721,019 B2* | 4/2004 | Kono | ................. | G02F 1/13338 349/12 |
| 7,385,347 B2* | 6/2008 | Song | .................. | H01L 51/5246 313/504 |
| 7,501,682 B2* | 3/2009 | Choi | ................. | H01L 21/28273 257/321 |

(Continued)

FOREIGN PATENT DOCUMENTS

| | | |
|---|---|---|
| KR | 10-2006-0036523 | 5/2006 |
| KR | 10-2006-0082468 | 7/2006 |

(Continued)

*Primary Examiner* — Jayprakash N Gandhi
(74) *Attorney, Agent, or Firm* — H.C. Park & Associates, PLC (57) ABSTRACT

Provided is a display apparatus including a display panel, a covering member, and an intermediate member. The intermediate member includes a base material including an insulating material and a heat transfer particle, and is disposed between the display panel and the covering member The display panel includes: a substrate; an encapsulation member which faces the substrate; and a display device which is arranged between the substrate and the encapsulation member and displays an image, the covering member is arranged to face the display panel, and the intermediate member is disposed in a gap between the covering member and an area of the substrate where the encapsulation member is not disposed.

2 Claims, 7 Drawing Sheets

(56) References Cited

U.S. PATENT DOCUMENTS

| | | | | |
|---|---|---|---|---|
| 7,564,185 | B2* | 7/2009 | Song | H01L 27/3276 313/504 |
| 2001/0043291 | A1* | 11/2001 | Kono | G02F 1/13338 349/12 |
| 2001/0046021 | A1* | 11/2001 | Kozuka | C09J 9/02 349/150 |
| 2006/0089456 | A1* | 4/2006 | Lee | C08F 283/126 525/63 |
| 2008/0108393 | A1* | 5/2008 | Kim | G02F 1/1333 455/566 |
| 2008/0246744 | A1* | 10/2008 | Park | G06F 3/0416 345/173 |
| 2009/0322214 | A1* | 12/2009 | Lee | H01L 51/524 313/504 |
| 2010/0307797 | A1* | 12/2010 | Watanabe | H05K 1/0281 174/254 |
| 2012/0249927 | A1* | 10/2012 | Nakagawa | G02F 1/133615 349/65 |
| 2012/0256205 | A1* | 10/2012 | Low | H01L 33/642 257/88 |
| 2012/0261713 | A1* | 10/2012 | Koo | H01L 51/529 257/100 |
| 2012/0305899 | A1* | 12/2012 | Taki | C08G 61/126 257/40 |
| 2014/0168744 | A1* | 6/2014 | Li | G02F 1/155 359/266 |
| 2014/0176840 | A1* | 6/2014 | Hashido | G02F 1/13306 349/33 |
| 2014/0268595 | A1* | 9/2014 | Eom | H05K 1/028 361/749 |

FOREIGN PATENT DOCUMENTS

| | | |
|---|---|---|
| KR | 10-2008-0091609 | 10/2008 |
| KR | 10-2010-0001275 | 1/2010 |
| KR | 10-2013-0078143 | 7/2013 |

* cited by examiner

DISPLAY APPARATUS

CROSS-REFERENCE TO RELATED APPLICATION

This application claims priority from and the benefit of Korean Patent Application No. 10-2014-0117024, filed on Sep. 3, 2014, which is hereby incorporated by reference for all purposes as if fully set forth herein.

BACKGROUND

Field

One or more embodiments of the present invention relate to a display apparatus.

Discussion of the Background

Display apparatuses are one type of popular consumer electronic devices. In particular, as the size of display apparatuses become smaller and have thinner thickness and light weight, users' usage range of various display devices has been widened. For some display devices, a self-emissive display apparatus which consumes lower power and has good viewing angles and definition has been adopted.

Display apparatuses generally include a display panel including a display device configured to display an image for a user.

Display apparatuses may further include a covering member in order to protect the display panel and improve the durability and user convenience.

A stable connection of the display panel and the covering member may affect the entire durability of the display apparatuses.

Also, heat generated from display apparatuses may affect the electrical properties of the display apparatuses, and thus the heat needs to be effectively emitted.

The above information disclosed in this Background section is only for enhancement of understanding of the background of the inventive concept, and, therefore, it may contain information that does not form the prior art that is already known in this country to a person of ordinary skill in the art.

SUMMARY

One or more embodiments of the present invention include a display apparatus having improved durability and electrical properties.

Additional aspects will be set forth in part in the description which follows and, in part, will be apparent from the description, or may be learned by practice of the presented embodiments.

According to one or more embodiments of the present invention, a display apparatus which improves durability and electrical properties may be provided.

According to one or more embodiments of the present invention, a display apparatus includes: a display panel, a covering member, and an intermediate member. The intermediate member includes a base material including an insulating material and a heat transfer particle, and the intermediate member is disposed between the display panel and the covering member. The display panel includes: a substrate; an encapsulation member which faces the substrate; and a display device arranged between the substrate and the encapsulation member. The covering member is arranged to face the display panel, and the intermediate member is disposed in a gap between the covering member and an area of the substrate where the encapsulation member is not disposed.

According to one or more embodiments of the present invention, a display apparatus including: a display panel including one or more display devices to display an image to a user; a covering member arranged to face the display panel; a bonding member to bond the display panel and the covering member, the bonding member being arranged between the display panel and the covering member; and an intermediate member disposed in a gap between the display panel and the covering member where the bonding member is not arranged, the intermediate member including a base material including an insulating material and a heat transfer particle.

According to one or more embodiments of the present invention, a display apparatus comprising: a display panel; an encapsulation member disposed on a first portion of a surface of the display panel; a layer disposed on a first portion of a surface of the encapsulation member; a covering member disposed on the layer, the covering member having a surface wider than the surface of the encapsulation member; and an intermediate member comprising a base material comprising an insulating material and a heat transfer particle, the intermediate member disposed between the display panel and the covering member. The intermediate member is disposed on a second portion of the surface of the display panel and a second portion of the surface of the encapsulation member The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

As the invention allows for various changes and numerous embodiments, particular embodiments will be illustrated in the drawings and described in detail in the written description. The attached drawings for illustrating exemplary embodiments of the present invention are referred to in order to gain a sufficient understanding of the present invention, the merits thereof, and the objectives accomplished by the implementation of the present invention. The invention may, however, be embodied in many different forms and should not be construed as being limited to the embodiments set forth herein.

While such terms as "first", "second", etc., may be used to describe various components, such components must not be limited to the above terms. The above terms are used only to distinguish one component from another.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

The present invention will now be described more fully with reference to the accompanying drawings, in which exemplary embodiments of the invention are shown.

Like reference numerals in the drawings denote like elements, and thus their description will be omitted.

Figure 1:
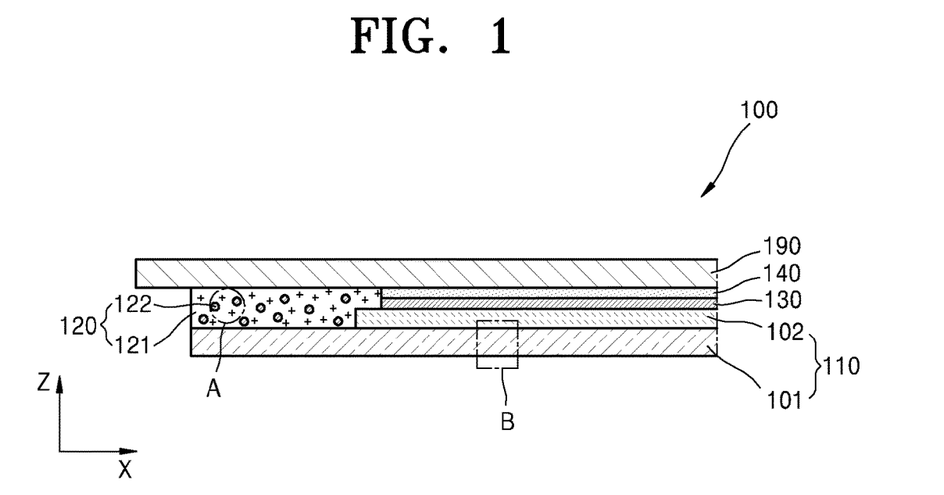
FIG. 1 is a schematic cross-sectional view of a display apparatus according to an exemplary embodiment of the present invention.
Figure 2:
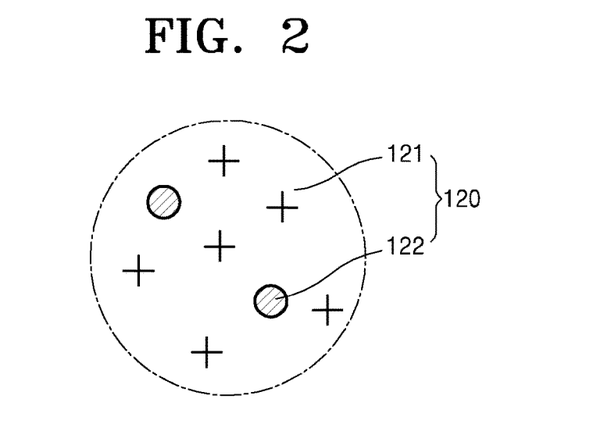
FIG. 2 is an enlarged diagram of an area A of FIG. 1.

FIG. 1 is a schematic cross-sectional view of a display apparatus 100 according to an exemplary embodiment of the present invention, and FIG. 2 is an enlarged diagram of an area A of FIG. 1.

Referring to FIG. 1 and FIG. 2, the display apparatus 100 includes a display panel 110, an intermediate member 120, and a covering member 190.

The display panel 110 includes a substrate 101, an encapsulation member 102, and a display device (not shown), and the intermediate member 120 includes a base material 121 and heat transfer particles 122.

The display panel 110 may include one or more display devices in order to display an image to a user. For example, the display panel 110 may include a display device, such as an organic light-emitting device or a liquid crystal display device. The display panel 110 may include various display devices other than the above-listed display devices.

The display device of the display panel 110 will be described with reference to FIG. 5.

The substrate 101 may be formed of various materials. For example, the substrate 101 may be formed of a glass material which mainly contains silicon dioxide ($SiO_2$). Also, the substrate 101 may be formed of a flexible material, for example, flexible plastics. As a selective example, the substrate 101 may include metals.

The encapsulation member 102 may be arranged to face the substrate 101. The encapsulation member 102 may include the same materials included in the substrate 101, for example, a glass material which mainly contains $SiO_2$.

As a selective example, the encapsulation member 102 may include a thin film or a film-type thin film. For example, the encapsulation member 102 may include one or more organic layers or one or more inorganic layers. Further, the encapsulation member 102 may have a structure in which one or more organic layers and one or more inorganic layers are alternately stacked at least one time.

Although not illustrated, a sealing member (not shown) may be arranged to bond the substrate 101 and the encapsulation member 102. The sealing member may be, for example, arranged around the display device (not shown) arranged between the substrate 101 and the encapsulation member 102 and may bond the substrate 101 and the encapsulation member 102 to each other.

As a selective example, the encapsulation member 102 may not cover a portion of a surface of the substrate 101. More specifically, a portion of a surface of the substrate 101 may not be covered by the encapsulation member 102 and may be exposed to the outside. For example, the encapsulation member 102 may be smaller than the substrate 101.

As a selective example, the encapsulation member 102 may have a smaller area than that of the substrate 101.

As a selective example, the display panel 110 may include a touch pattern (not shown) which embodies a touch detection function.

The covering member 190 may be arranged on an upper surface of the display panel 110. As a selective example, the covering member 190 may be arranged to face the encapsulation member 102 of the display panel 110.

The covering member 190 prevents the display panel 110 from being damaged due to external forces or impacts and improves the durability of the display panel 110. The covering member 190 may be formed of various materials, for example, glass materials or plastics. As a selective example, if light emitted by the display panel 110 needs to be transmitted to the user through the covering member 190, the covering member 190 may be formed of light-transmissive materials.

As a selective example, a bonding member 140 may be arranged between the covering member 190 and the display panel 110. For example, the bonding member 140 may be arranged between the covering member 190 and the encapsulation member 102.

The bonding member 140 bonds the covering member 190 and the display panel 110 to each other. For example, the bonding member 140 may include various bonding materials. As a selective example, the bonding member 140 may include an organic material, for example, a resin-based bonding material.

As a selective example, the bonding member 140 may be formed by forming a liquid resin or flexible resin material between the covering member 190 and the display panel 110.

As a selective example, a polarization member 130 may be further arranged between the display panel 110 and the covering member 190. For example, the polarization member 130 may be arranged between the bonding member 140 and the display panel 110. The polarization member 130 improves properties of visible rays emitted by the display panel 110, changes the visible rays emitted by the display panel 110 to make the user recognize light, or may improve a definition property of the display apparatus 100 by decreasing or preventing the reflection of external light in the display panel 110.

The intermediate member 120 includes the base material 121 and the heat transfer particles 122. The intermediate member 120 may be arranged between an area of the substrate 101 of the display panel 110, which is not covered by the encapsulation member 102, and the covering member 190.

As a selective example, the intermediate member 120 may be arranged between the covering member 190 and an area of the encapsulation member 102, which is not covered by the bonding member 140 or the polarization member 130. In this case, the intermediate member 120 may be arranged to contact sides of the encapsulation member 102, and the durability of the display panel 110 may be enhanced by adhering the intermediate member 120 to the encapsulation member 102.

As a selective example, the intermediate member 120 may be arranged on an area where the display panel 110 is bonded to the covering member 190 from among areas disposed between the display panel 110 and the covering member 190. The intermediate member 120 may be arranged on an area other than an area where the bonding member 140 is arranged as shown in FIG. 1, for example.

The intermediate member 120 may be arranged in a space between the display panel 110 and the covering member 190, and as a selective example, the intermediate member 120 may fill the space between the display panel 110 and the covering member 190.

The intermediate member 120 may have a form in which the base material 121 is mixed with the heat transfer particles 122. The base material 121 may include various insulating materials. As a selective example, the base material 121 may include organic materials. For example, the base material 121 may include a resin-based material. The base material 121 may be arranged between the display panel 110 and the covering member 190 so that the base material 121 may prevent the display panel 110 and the covering member 190 from being damaged by an external impact. In particular, if the substrate 101 has a larger area than the encapsulation member 102, when the base material 121 fills the space between the covering member 190 and an area of the substrate 101, which does not correspond to the encapsulation member 102, the overall durability of the display apparatus 100 may be improved.

The plurality of heat transfer particles 122 may be arranged in the base material 121 and may be formed of materials having a good heat transfer property. The heat transfer particles 122 may include metals or carbon-based materials. For example, the heat transfer particles 122 may include copper (Cu). As another example, the heat transfer particles 122 may include graphite.

The heat transfer particles 122 are arranged in the base material 121 and may effectively emit heat generated in the display apparatus 100, in particular, in the display panel 110. Through the effective emission of the heat, a possibility of an abnormal operation of the display panel 110 may be reduced or controlled, thereby improving the electrical properties or definition properties of the display apparatus 100.

Shapes of the heat transfer particles 122 may vary. In FIG. 2, the heat transfer particles 122 have a cross-section which is similar to a circle, and the heat transfer particles 122 may have a shape similar to a sphere.

Figure 3:
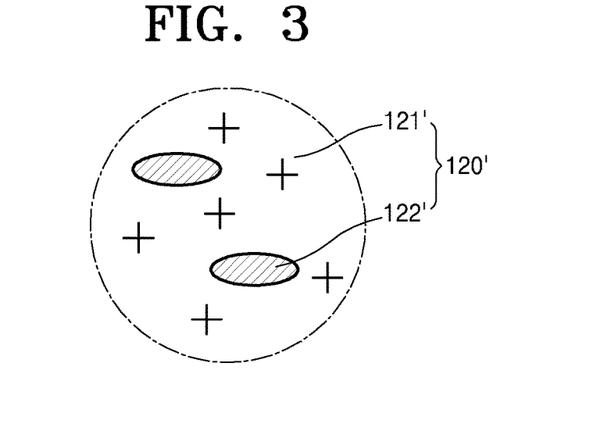
FIGS. 3 and 4 illustrate modified examples of FIG. 2.
Figure 4:
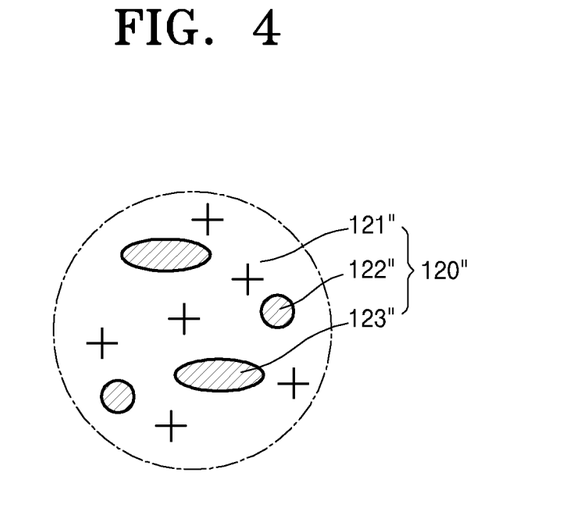

The heat transfer particles 122 may have different shapes. FIGS. 3 and 4 illustrate modified examples of FIG. 2; however, aspects of the present invention are not limited as such.

As shown in FIG. 3, an intermediate member 120' as a modified example includes a base material 121' and heat transfer particles 122', and the heat transfer particles 122' may have an oval-shape according to a cross-sectional view.

Also, as shown in FIG. 4, an intermediate member 120" as another modified example includes a base material 121" and heat transfer particles 122". The heat transfer particles 122" may have a circle shape as a cross-sectional view thereof and the heat transfer particles 123" may have an oval shape as a cross-sectional view thereof.

Although not illustrated, the heat transfer particles 122 may have various shapes, e.g., a pillar shape, a polygonal shape, a tube shape, a chip shape, etc.

Figure 5:
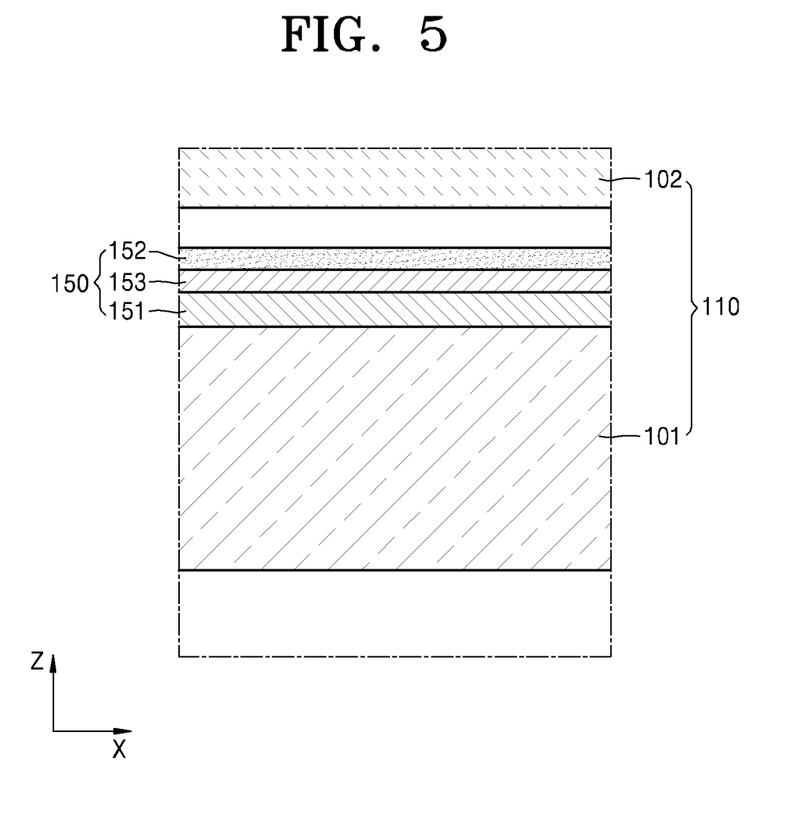
FIG. 5 is an enlarged diagram of an area B of FIG. 1.

Referring to FIG. 5, the display device included in the display panel 110 will be described. FIG. 5 is an enlarged diagram of an area B of FIG. 1.

As described above, the display panel 110 may include the display device arranged between the substrate 101 and the encapsulation member 102, and types of the display device may vary.

With regard to FIG. 5, an organic light-emitting device 150 will be described as the display device. However, other display devices other than the organic light-emitting device 150 may be used. For example, the display panel 110 may include at least one display device including a liquid crystal display device.

Referring to FIG. 5, the organic light-emitting device 150 may be arranged between the substrate 101 and the encapsulation member 102.

The organic light-emitting device 150 includes a first electrode 151, a second electrode 152, and an intermediate layer 153.

Although not illustrated, a buffer layer (not shown) may be further formed or disposed on the first electrode 151 and the substrate 101. The buffer layer (not shown) provides a plane on the substrate 101 and may prevent gases or moisture from penetrating through the substrate 101.

The first electrode 151 functions as an anode, and the second electrode 152 functions as a cathode. However, polarities thereof may be switched.

If the first electrode 151 functions as an anode, the first electrode 151 may include indium tin oxide (ITO), indium zinc oxide (IZO), zinc oxide (ZnO), indium oxide ($In_2O_3$), or the like, which has a high work function. Also, according to an object and design conditions, the first electrode 151 may further include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), calcium (Ca) or the like.

If the second electrode 152 functions as a cathode, the second electrode 152 may include metals, such as Ag, Mg, Al, Pt, Pd, Au, Ni, Nd, Ir, Cr, Li, or Ca. Also, the second electrode 152 may include ITO, IZO, ZnO, $In_2O_3$, or the like, in order to enable light transmission.

The intermediate layer 153 may include an emission layer in order to emit visible rays. For example, the intermediate layer 153 includes an organic emission layer and may selectively include at least one of a hole injection layer, a hole transport layer, an electron transport layer, and an electron injection layer in addition to the organic emission layer.

When a voltage is applied to the first electrode 151 and the second electrode 152, visible rays are emitted from the intermediate layer 153, in particular, the emission layer of the intermediate layer 153.

Although not illustrated, the display panel 110 may include one or more thin film transistors (TFTs) (not shown), which are electrically connected to the organic light-emitting device 150. Also, the display panel 110 may include one or more capacitors, which are electrically connected to the organic light-emitting device 150.

The display apparatus 100 may include an intermediate member 120 between the display panel 110 and the covering member 190. Since the intermediate member 120 is arranged between the display panel 110 and the covering member 190, damage to the display panel 110 and the covering member 190 due to external impact may be prevented or reduced. In particular, the substrate 101 may have a larger area than the encapsulation member 102 so that a space exists between the covering member 190 and the substrate 101 as shown in FIG. 1. The space between the substrate 101 and the covering member 190 where the encapsulation member 102 is not disposed may be filled with the base material 121 to improve the overall durability of the display apparatus 100.

Also, the intermediate member 120 may include the heat transfer particles 122 and may more effectively emit heat generated by the display panel 110 to the outside. Thus, a possibility of an abnormal operation of the display panel 110 may be reduced or controlled, thereby improving the electrical properties or definition properties of the display apparatus 100.

Figure 6:
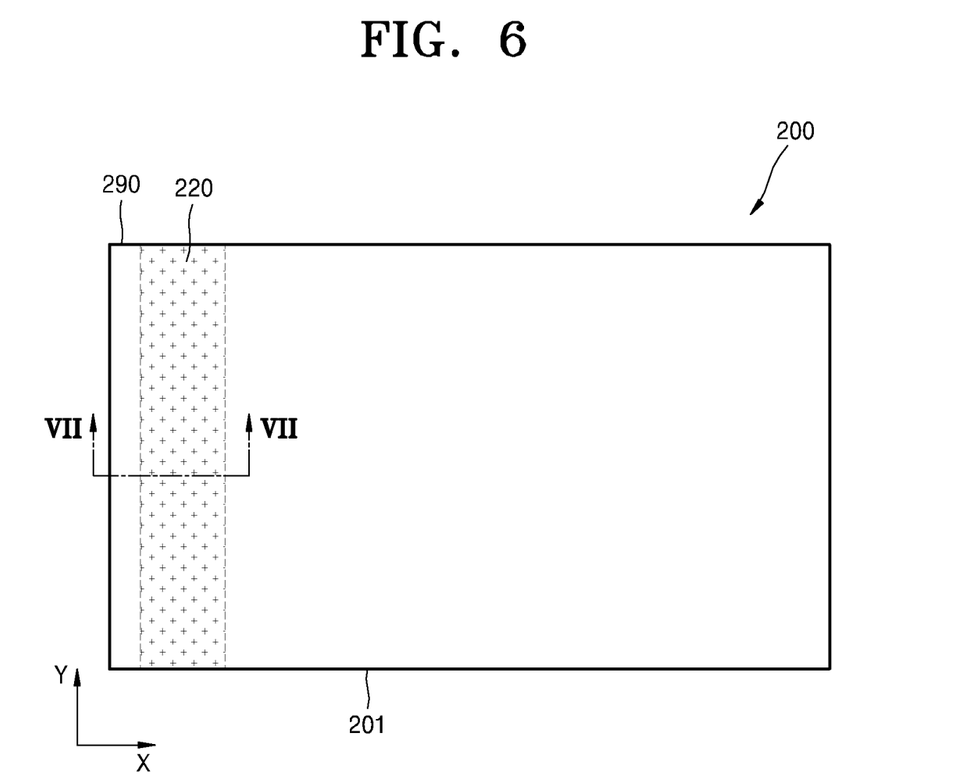
FIG. 6 is a schematic plan view of a display apparatus according to an exemplary embodiment of the present invention.
Figure 7:
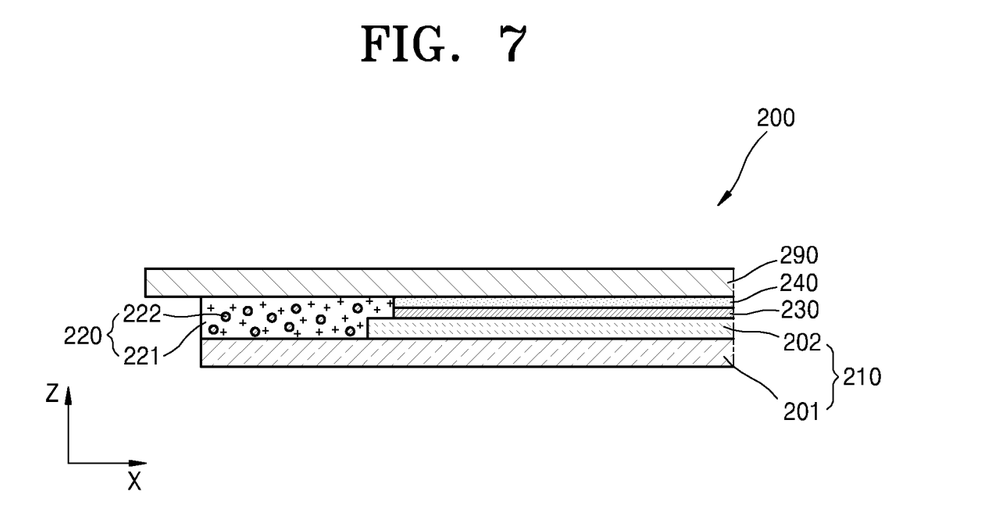
FIG. 7 is a cross-sectional view taken along a line VII-VII of FIG. 6.
Figure 8:
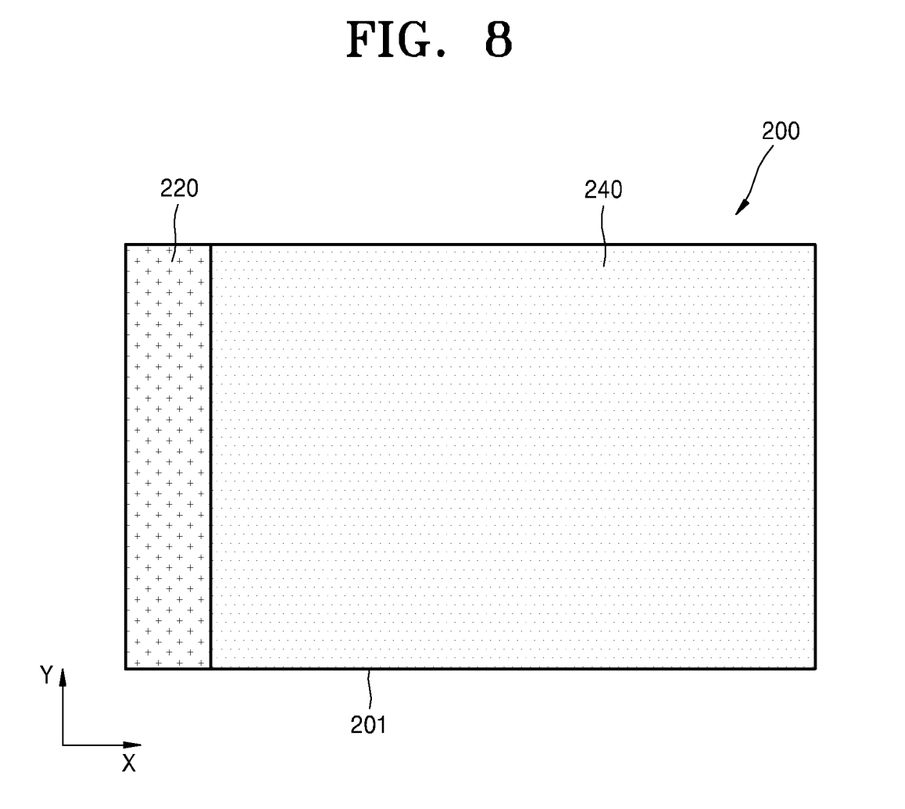
FIG. 8 illustrates that a covering member of FIG. 6 is removed.

FIG. 6 is a schematic plan view of a display apparatus 200 according to an exemplary embodiment of the present invention, and FIG. 7 is a cross-sectional view taken along a line VII-VII of FIG. 6. FIG. 8 illustrates that a covering member 290 of FIG. 6 is removed.

Referring to FIG. 6 through FIG. 8, the display apparatus 200 includes a display panel 210, an intermediate member 220, and the covering member 290. For conciseness, differences between the examples illustrated in FIG. 6 through FIG. 8 and the above-described examples illustrated in the preceding figures, e.g., FIG. 1 to FIG. 5 will be described in more detail, and the description of the same features therebetween may be omitted.

The display panel 210 includes a substrate 201, an encapsulation member 202, and a display device (not shown), and the intermediate member 220 includes a base material 221, and heat transfer particles 222.

The display panel 210 may include one or more display devices in order to display an image to a user. For example, the display panel 210 may include display devices, such as an organic light-emitting device or a liquid display device. The display panel 210 may include various display devices other than the above-listed display devices. Also, the display panel 210 may include the organic light-emitting device 150 of FIG. 5.

The covering member 290 may be arranged on the display panel 210. As a selective example, the covering member 290 may be arranged to face the encapsulation member 202 of the display panel 210.

As a selective example, a bonding member 240 may be arranged between the covering member 290 and the display panel 210. For example, the bonding member 240 may be arranged between the covering member 290 and the encapsulation member 202.

As shown in FIG. 8, the intermediate member 220 may extend to correspond to an edge of the substrate 201, e.g., a left edge thereof. Also, as a selective example, the intermediate member 220 may contact the bonding member 240. More specifically, sides of the intermediate member 220 may contact an adhesive of the bonding member 240.

Thus, a gap between the display panel 210 and the covering member 290 is reduced, and the durability of the display apparatus 200 may be improved.

As a selective example, a polarization member 230 may be further arranged between the display panel 210 and the covering member 290, and for example, the polarization member 230 may be arranged between the bonding member 240 and the display panel 210.

The intermediate member 220 includes the base material 221 and the heat transfer particles 222. The intermediate member 220 may be arranged between the covering member 290 and an area of the substrate 201 of the display panel 210, which is not covered by the encapsulation member 202.

As a selective example, the intermediate member 220 may be arranged between the covering member 290 and an area of the encapsulation member 202, which is not covered by the bonding member 240 or the polarization member 230.

As a selective example, the intermediate member 220 may be arranged on an area where the display panel 210 is bonded to the covering member 290 from among areas disposed between the display panel 210 and the covering member 290. More specifically, the intermediate member 200 may be disposed, between the covering member 290 and an area of the encapsulation member 202, on an area other than an area where the bonding member 240 is arranged.

The intermediate member 220 may be arranged on a space between the display panel 210 and the covering member 290, and as a selective example, the intermediate member 220 may fill the space between the display panel 210 and the covering member 290.

The base material 221 and the heat transfer particles 222 of the intermediate member 220 may be the same as those described above with respect to FIG. 1 to FIG. 5, and thus detailed descriptions thereof will be omitted.

Figure 9:
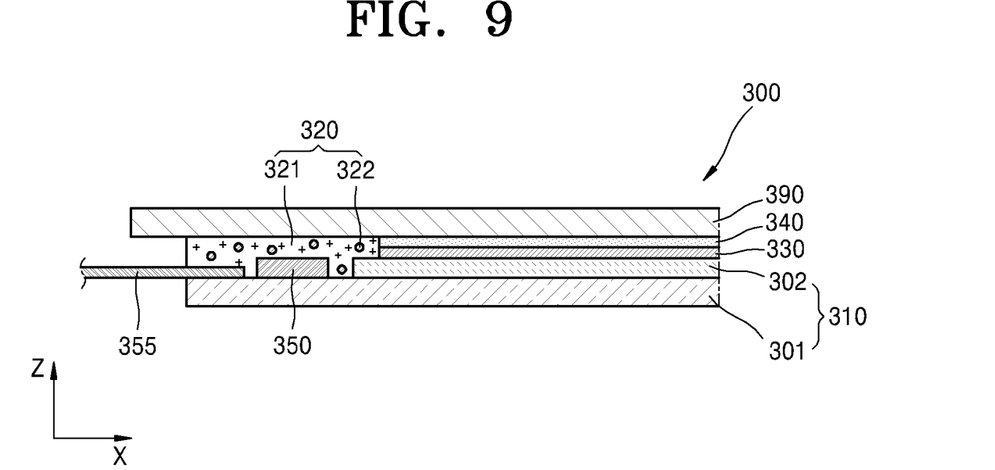
FIG. 9 is a schematic plan view of a display apparatus according to an exemplary embodiment of the present invention.

FIG. 9 is a schematic plan view of a display apparatus 300 according to an exemplary embodiment of the present invention.

Referring to FIG. 9, the display apparatus 300 includes a display panel 310, an intermediate member 320, a covering member 390, an integrated circuit (IC) 350, and a main circuit member 355. For conciseness, differences between the example illustrated in FIG. 9 and the above-described examples illustrated in the preceding figures, e.g., FIG. 1 to FIG. 8 will be described in more detail, and the description of the same features therebetween may be omitted.

The display panel 310 includes a substrate 301, an encapsulation member 302, and a display device (not shown), and the intermediate member 320 includes a base material 321 and heat transfer particles 322.

The display panel 310 may include one or more display devices in order to display an image to a user. For example, the display panel 310 may include display devices, such as an organic light-emitting device or a liquid display device. The display panel 310 may include various display devices other than the above-listed display devices. Also, the display panel 310 may include the organic light-emitting device 150 of FIG. 5.

The covering member 390 may be arranged on the display panel 310. As a selective example, the covering member 390 may be arranged to face the encapsulation member 302 of the display panel 310.

As a selective example, a bonding member 340 may be arranged between the covering member 390 and the display panel 310. For example, the bonding member 340 may be arranged between the covering member 390 and the encapsulation member 302.

The IC 350 may be arranged on a first portion of a surface of the substrate 301 where the encapsulation member 302 is not disposed. The encapsulation member 302 may be disposed on a second portion of the surface of the substrate 301 so that the IC 350 and the encapsulation member 302 are disposed on the same surface of the substrate 301 as shown in FIG. 9. The IC 350 may, for example, transmit, to the display panel 310, electrical signals necessary to operate the display panel 310 of the display apparatus 300.

As a selective example, the main circuit member 355 may be electrically connected to the IC 350 disposed on the surface of the substrate 301. An end of the main circuit member 355 is electrically connected to a circuit board (not shown). The main circuit member 355 receives electrical signals from the circuit board and may transmit the received electrical signals to the IC 350. Also, the main circuit member 355 may transmit the electrical signals to the circuit board.

As a selective example, the main circuit member 355 may include a flexible material. For example, the main circuit member 355 may be a flexible printed circuit (FPC). Further, the main circuit member 355 may be a flexible printed circuit board (FPCB).

If the main circuit member 355 is configured to include a flexible material, the main circuit member 355 may be curved so that an end thereof is arranged to face a surface opposite to the surface of the substrate 301 on which the encapsulation member 302 is disposed.

As shown in FIG. 9, the intermediate member 320 may cover the IC 350, and as a selective example, the intermediate member 320 may contact and surround the exposed surfaces of the IC 350. Also, the intermediate member 320 may cover an area of the main circuit member 355 which corresponds to at least the substrate 301 from among areas of the main circuit member 355.

As a selective example, a polarization member 330 may be further arranged between the display panel 310 and the covering member 390, and for example, the polarization member 330 may be arranged between the bonding member 340 and the display panel 310.

The intermediate member 320 includes the base material 321 and the heat transfer particles 322. The intermediate member 320 may be arranged between the covering member 390 and an area of the substrate 301 of the display panel 310, which is not covered by the encapsulation member 302.

As a selective example, the intermediate member 320 may be arranged between the covering member 390 and an area of the encapsulation member 302, which is not covered by the bonding member 340 and/or the polarization member 330.

As a selective example, the intermediate member 320 may be arranged on an area where the display panel 310 is bonded to the covering member 390 from among areas disposed between the display panel 310 and the covering member 390. More specifically, the intermediate member 320 may fill the space between the display panel 310 and the covering member 390 on an area other than an area where the bonding member 340 is arranged.

The intermediate member 320 may be arranged on a space between the display panel 310 and the covering member 390, and as a selective example, the intermediate member 320 may fill the space between the display panel 310 and the covering member 390.

The base material 321 and the heat transfer particles 322 of the intermediate member 320 may be the same as those described above, e.g., base materials 121, 121' and 121'' and heat transfer particles 122, 122', 122'', and 123'', and thus detailed descriptions thereof will be omitted.

The intermediate member 320 may cover and protect the IC 350. Since the intermediate member 320 covers an area of the main circuit member 355 which corresponds to the substrate 301 from among areas of the main circuit member 355, the main circuit member 355 may be more stably connected to the substrate 301. The main circuit member 355 may be stably disposed on the substrate 301. Further, the main circuit member 355 may be electrically connected to the IC 350.

Also, due to operation of the display panel 310, heat may be generated by the IC 350 and the main circuit member 355. If the temperatures of the IC 350 and the main circuit member 355 exceed certain thresholds, electrical properties of the IC 350 and the main circuit member 355 may be degraded or electrical defects may occur. The heat generated by the IC 350 and the main circuit member 355 may be effectively emitted through the heat transfer particles 322 of the intermediate member 320, and thus the electrical properties of the IC 350 and the main circuit member 355 may be enhanced by the heat transfer particles 322 around the IC 350 and the main circuit member 355.

Figure 10:
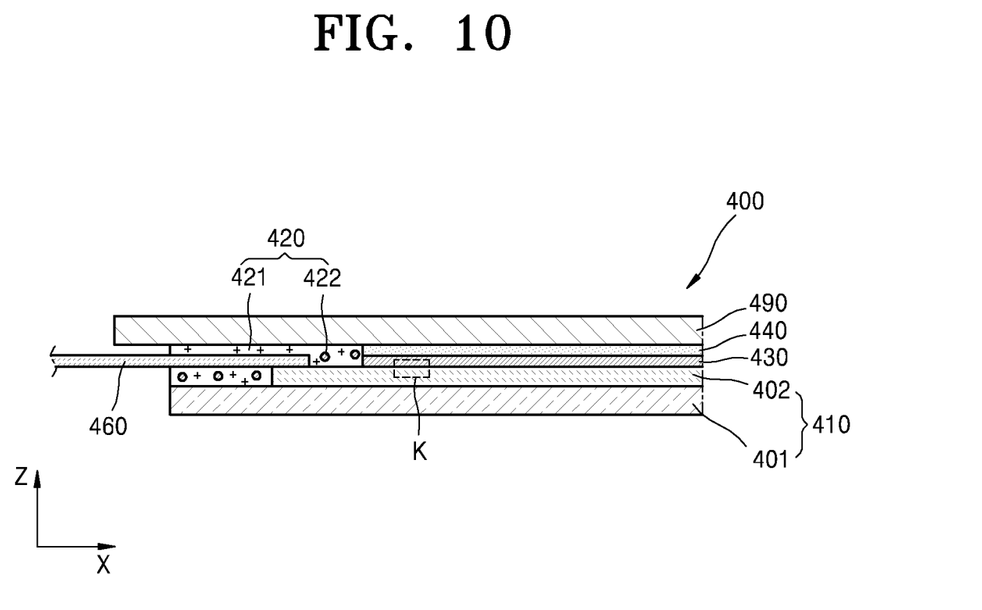
FIG. 10 is a schematic plan view of a display apparatus according to an exemplary embodiment of the present invention.
Figure 11:
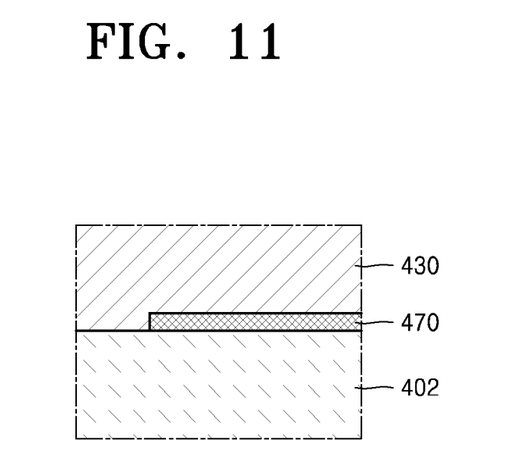
FIG. 11 is an enlarged diagram of an area K of FIG. 10.

FIG. 10 is a schematic plan view of a display apparatus 400 according to an exemplary embodiment of the present invention, and FIG. 11 is an enlarged diagram of an area K of FIG. 10.

Referring to FIG. 10 and FIG. 11, the display apparatus 400 includes a display panel 410, an intermediate member 420, a covering member 490, and a circuit member 460 for touch input signals. For conciseness, differences between the examples illustrated in FIG. 6 through FIG. 8 and the above-described examples illustrated in the preceding figures will be described in more detail, and the description of the same features therebetween may be omitted.

The display panel 410 includes a substrate 401, an encapsulation member 402, and a display device (not shown), and the intermediate member 420 includes a base material 421 and heat transfer particles 422.

The display panel 410 may include one or more display devices in order to display an image to a user. For example, the display panel 410 may include display devices, such as an organic light-emitting device or a liquid display device. The display panel 410 may include various display devices other than the above-listed display devices. Also, the display panel 410 may include the organic light-emitting device 150 of FIG. 5.

The covering member 490 may be arranged on the display panel 410. As a selective example, the covering member 490 may be arranged to face the encapsulation member 402 of the display panel 410.

As a selective example, a bonding member 440 may be arranged between the covering member 490 and the display panel 410. For example, the bonding member 440 may be arranged between the covering member 490 and the encapsulation member 402.

As shown in FIG. 10 and FIG. 11, a touch pattern 470 may be formed on a surface of the encapsulation member 402. In particular, the touch pattern 470 may be formed on a surface opposite to a surface which is close to the substrate 401, that is, the upper surface of the encapsulation member 402.

Although not illustrated, as a selective example, the touch pattern 470 may be formed on a lower surface of the encapsulation member 402.

As another selective example, the touch pattern 470 may be formed on a surface of the substrate 401 and may be formed between the substrate 401 and the encapsulation member 402.

Although not illustrated, a separate panel including the touch pattern 470 may be arranged adjacent to the display panel 410.

Forms of the touch pattern 470 may vary. For example, the touch pattern 470 may include one conductive pattern. Further, as a selective example, the touch pattern 470 may include multiple conductive patterns. Also, the touch pattern 470 may include two or more conductive patterns that have one or more insulating layers interposed therebetween.

The circuit member 460 may transmit electrical signals to the touch pattern 470. As a detailed example, the circuit member 460 receives electrical signals from a circuit (not shown), which may be arranged outside the display panel 410 and may transmit the received electrical signals to the touch pattern 470.

More specifically, although not illustrated, the circuit member 460 may be electrically connected to the touch pattern 470 through wires (not shown) or a conductive pattern (not shown).

The circuit member 460 may have various forms, and types of the circuit member 460 may vary. As a selective example, the circuit member 460 may include flexible materials. For example, the circuit member 460 may be an FPC. The circuit member 460 may be an FPCB.

If the circuit member 460 is flexible, the circuit member 460 may be curved so that an end thereof may be arranged to face a surface opposite to the surface of the substrate 401 on which the encapsulation member 402 is disposed.

The intermediate member 420 may cover an area of the circuit member 460 which corresponds to the substrate 401 from among areas of the circuit member 460, e.g., an area corresponding to an area disposed between the substrate 401 and the covering member 490 as shown in FIG. 10.

As a selective example, the intermediate member 420 may be arranged to surround the circuit member 460 in part as shown in FIG. 10. More specifically, the intermediate member 420 may surrounds exposed surfaces of the circuit member 460 by disposing the intermediate member 420 within the space between the substrate 401 and the covering member 490.

As a selective example, a polarization member 430 may be further arranged between the display panel 410 and the covering member 490. For example, the polarization member 430 may be arranged between the bonding member 440 and the display panel 410.

The intermediate member 420 includes the base material 421 and the heat transfer particles 422. The intermediate member 420 may be arranged between the covering member 490 and an area of the substrate 401 of the display panel 410, which is not covered by the encapsulation member 402 from among areas of the substrate 401 of the display panel 410.

As a selective example, the intermediate member 420 may be arranged between the covering member 490 and an area of the encapsulation member 402, which is not covered by the bonding member 440 or the polarization member 430.

As a selective example, the intermediate member 420 may be arranged on an area where the display panel 410 is not bonded to the covering member 490 from among areas disposed between the display panel 410 and the covering member 490. More specifically, between the covering member 490 and the display panel 410, the intermediate member 420 may be disposed on an area except for an area where the bonding member 440 is arranged.

The intermediate member 420 may be arranged on a space between the display panel 410 and the covering member 490, and as a selective example, the intermediate member 420 may fill the space between the display panel 410 and the covering member 490.

The base material 421 and the heat transfer particles 422 of the intermediate member 420 may be the same as those described above, e.g., base materials 121, 121' and 121" and heat transfer particles 122, 122', 122", and 123", and thus detailed descriptions thereof will be omitted.

Since the intermediate member 420 covers an area of the circuit member 460 which corresponds to the substrate 401 from among areas of the circuit member 460, the circuit member 460 may be stably disposed on the substrate 401. As shown in FIG. 10, the intermediate member 420 may cover the area of the circuit member 460 located in the space between the substrate 401 and the covering member 490. In particular, as a selective example, if the intermediate member 420 is arranged to fill the space between the substrate 401 and the covering member 490, the intermediate member 420 adheres to the circuit member 460, and the durability of the circuit member 460 may be improved.

Also, due to an operation of the circuit member 460, heat may be generated by the circuit member 460. If the temperature of the circuit member 460 exceeds a certain threshold, electrical properties of the circuit member 460 may be degraded or electrical defects may occur. The heat generated by the circuit member 460 may be effectively emitted through the heat transfer particles 422 of the intermediate member 420, and thus the electrical properties of the circuit member 460 may be enhanced.

Figure 12:
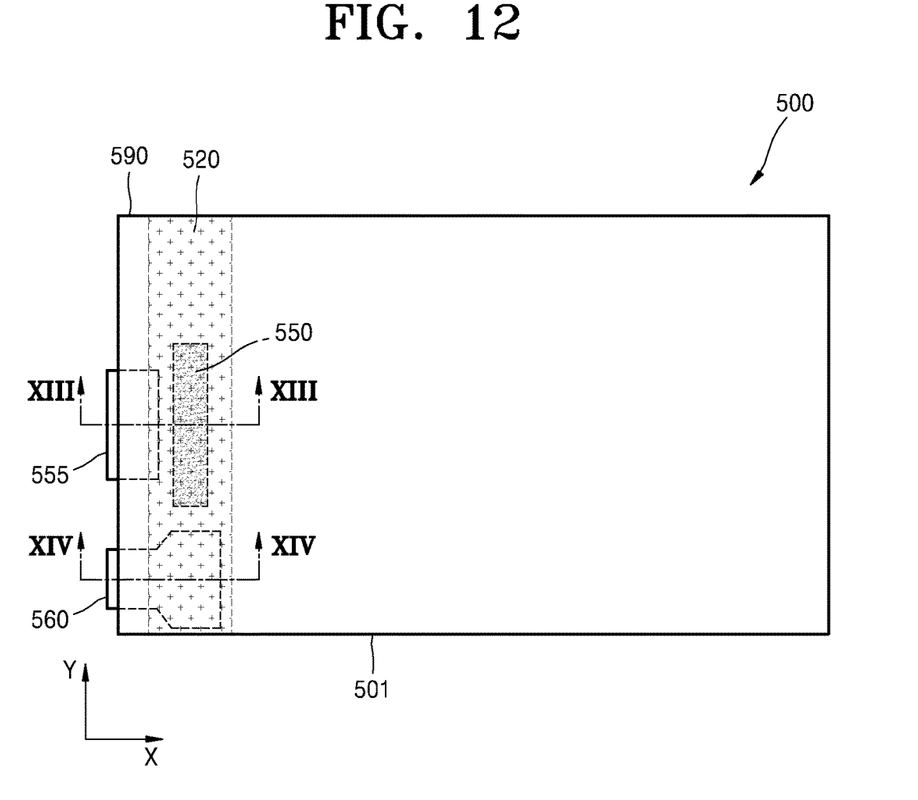
FIG. 12 is a schematic plan view of a display apparatus according to an exemplary embodiment of the present invention.
Figure 13:
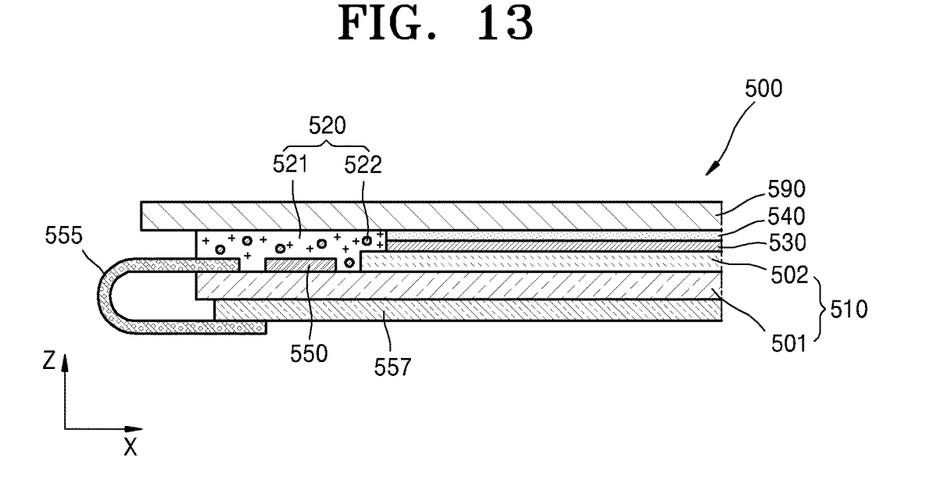
FIG. 13 is a cross-sectional view taken along a line XIII-XIII of FIG. 12.
Figure 14:
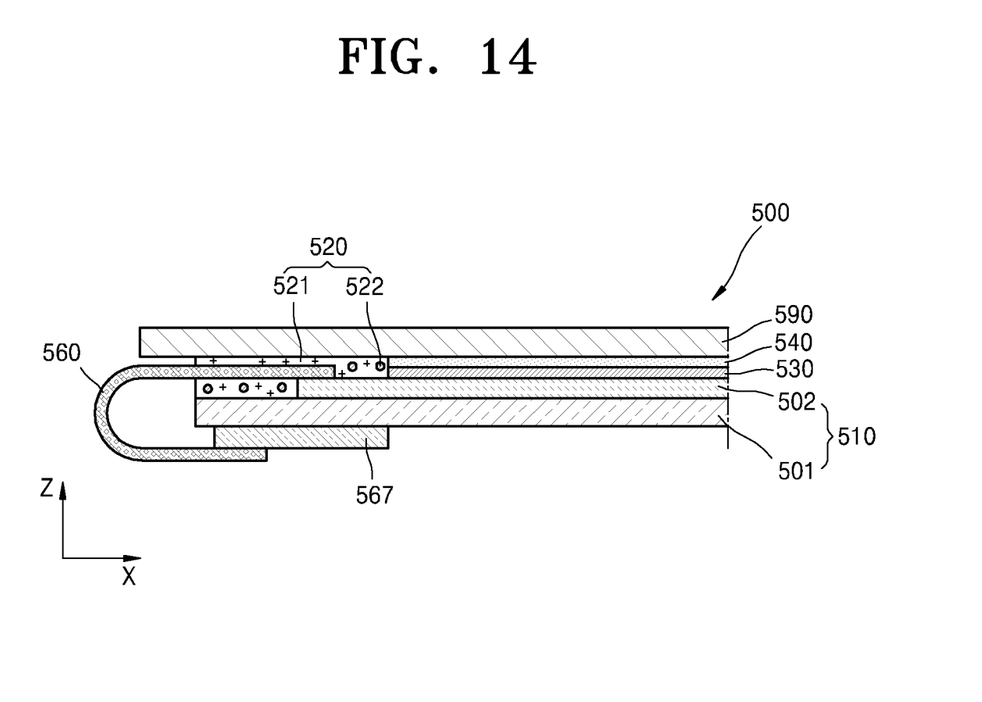
FIG. 14 is a cross-sectional view taken along a line XIV-XIV of FIG. 12.

FIG. 12 is a schematic plan view of a display apparatus 500 according to an exemplary embodiment of the present invention, FIG. 13 is a cross-sectional view taken along a line XIII-XIII of FIG. 12, and FIG. 14 is a cross-sectional view taken along a line XIV-XIV of FIG. 12.

In FIG. 12, a plan view of the top surface of a covering member 590 is illustrated, and an intermediate member 520, an IC 550, and a circuit member 560 for touch input signals, which are arranged on a lower surface of the covering member 590, are indicated by dashed lines.

Referring to FIG. 12 to FIG. 14, the display apparatus 500 includes a display panel 510, the intermediate member 520, the covering member 590, the IC 550, a main circuit member 555, and the circuit member 560. For conciseness, differences between the examples illustrated in FIG. 12 through FIG. 14 and the above-described examples illustrated in the preceding figures will be described in more detail, and the description of the same features therebetween may be omitted.

The display panel 510 includes a substrate 501, an encapsulation member 502, and a display device (not shown), and the intermediate member 520 includes a base material 521 and heat transfer particles 522.

The display panel 510 may include one or more display devices in order to display an image to a user. For example, the display panel 510 may include display devices, such as an organic light-emitting device or a liquid display device. The display panel 510 may include various display devices other than the above display devices. Also, the display panel 510 may include the organic light-emitting device 150 of FIG. 5.

The covering member 590 may be arranged on the display panel 510. As a selective example, the covering member 590 may be arranged to face the encapsulation member 502 of the display panel 510.

As a selective example, a bonding member 540 may be arranged between the covering member 590 and the display panel 510. For example, the bonding member 540 may be arranged between the covering member 590 and the encapsulation member 502.

As shown in FIG. 12 and FIG. 13, the intermediate member 520 may be disposed such that an edge of the intermediate member 520 corresponds to an edge of the substrate 501. Also, as a selective example, the intermediate member 520 may contact the bonding member 540. More specifically, a side of the intermediate member 520 may contact the bonding member 540 as shown in FIG. 13.

Thus, a possibility of a gap between the display panel 510 and the covering member 590 may be reduced, and the durability of the display apparatus 500 may be improved.

The IC 550 may be arranged on a surface of the substrate 501. The IC 550 may, for example, transmit, to the display panel 510, electrical signals to operate the display panel 510 of the display apparatus 500.

As a selective example, the main circuit member 555 may be electrically connected to the IC 550 disposed on the surface of the substrate 501. An end of the main circuit member 555 may be connected to a main circuit board 557. The main circuit member 555 receives electrical signals from the main circuit board 557 and may transmit the received electrical signals to the IC 550. Also, the main circuit member 555 may receive electrical signals from the IC 550 and may transmit the electrical signals to the main circuit board 557.

As a selective example, the main circuit member 555 may include flexible materials. For example, the main circuit member 555 may be an FPC. As another example, the main circuit member 555 may be an FPCB.

In the case of the main circuit member 555 having flexibility, as shown in FIG. 13, the main circuit member 555 may be curved, and an end thereof may be arranged to face a surface opposite to the surface of the substrate 501 on which the encapsulation member 502 is disposed. More specifically, the main circuit board 557 may be arranged on a lower surface of the substrate 501. A portion of the main circuit member 555 is curved, and an end thereof may be connected to the main circuit board 557 as shown in FIG. 13.

The intermediate member 520 may cover the IC 550. As a selective example, the intermediate member 520 may contact the IC 550. Also, the intermediate member 520 may cover an area of the main circuit member 555 which corresponds to at least the substrate 501 from among areas of the main circuit member 555.

A touch pattern (not shown) may be formed on a surface of the encapsulation member 502, e.g., an upper surface or a lower surface of the encapsulation member 502. As a selective example, the touch pattern may be formed on a surface of the encapsulation member 502 or may be formed between the substrate 501 and the encapsulation member 502.

Although not illustrated, a separate panel including the touch pattern may be arranged adjacent to the display panel 510.

The circuit member 560 may transmit electrical signals to the touch pattern. As a detailed example, the circuit member 560 receives electrical signals from a circuit board 567, which is arranged outside the display panel 510 and may transmit the received electrical signals to the touch pattern.

Forms and types of the circuit member 560 may vary. As a selective example, the circuit member 560 may include flexible materials. For example, the circuit member 560 may be an FPC. As another selective example, the circuit member 560 may be an FPCB.

In the case of the circuit member 560 and having flexibility, the circuit member 560 may be curved, and an end thereof may be arranged to face a surface opposite to the surface of the substrate 501 on which the encapsulation member 502 is disposed.

Specifically, the circuit board 567 may be arranged to correspond to the lower surface of the substrate 501, and the curved end of the circuit member 560 may be connected to the circuit board 567.

The intermediate member 520 may cover an area of the circuit member 560 which corresponds to at least the substrate 501 from among areas of the circuit member 560.

As a selective example, the intermediate member 520 may be arranged to surround the circuit member 560 to adhere to the circuit member 560.

As a selective example, a polarization member 530 may be further arranged between the display panel 510 and the covering member 590, and for example, the polarization member 530 may be arranged between the bonding member 540 and the display panel 510.

The intermediate member 520 includes the base material 521 and the heat transfer particles 522. The intermediate member 520 may be arranged between the covering member 590 and an area of the substrate 501 of the display panel 510, which is not covered by the encapsulation member 502 from among areas of the substrate 501 of the display panel 410.

As a selective example, the intermediate member 520 may be arranged between the covering member 590 and an area of the encapsulation member 502, which is not covered by the bonding member 540 or the polarization member 530.

As a selective example, the intermediate member 520 may be arranged between the covering member 590 and an area of the encapsulation member 502, which is not covered by the bonding member 540 or the polarization member 530.

As a selective example, the intermediate member 520 may be arranged on an area where the display panel 510 is not bonded to the covering member 590 from among areas disposed between the display panel 510 and the covering member 590. More specifically, the intermediate member 520 may be disposed on an area between the covering member 590 and the display panel 510 except for the area where the bonding member 540 is arranged.

The intermediate member 520 may be arranged in a space between the display panel 510 and the covering member 590, and as a selective example, the intermediate member 520 may fill the space between the display panel 510 and the covering member 590.

The base material 521 and the heat transfer particles 522 of the intermediate member 520 may be the same as those described above, e.g., base materials 121, 121' and 121" and heat transfer particles 122, 122', 122", and 123", and thus detailed descriptions thereof will be omitted.

Since the intermediate member 520 covers an area of the circuit member 560 which corresponds to the substrate 501 from among areas of the circuit member 560, the circuit member 560 may be stably connected to the substrate 501. As a selective example, if the intermediate member 520 is arranged to fill the space between the substrate 501 and the covering member 590, the intermediate member 520 adheres to the circuit member 560, and thus the durability of the circuit member 560 may be improved.

Also, due to an operation of the circuit member 560, heat may be generated by the circuit member 560. If the temperature of the circuit member 560 exceeds a certain threshold, electrical properties of the circuit member 560 may be degraded or electrical defects may occur. The heat generated by the circuit member 560 may be effectively emitted through the heat transfer particles 522 of the intermediate member 520, and thus the electrical properties of the circuit member 560 may be improved.

The intermediate member 520 may cover and protect the IC 550. Further, since the intermediate member 520 covers an area of the main circuit member 555, which corresponds to the substrate 501 from among areas of the main circuit member 555, the main circuit member 555 may be stably connected to the substrate 501 and may maintain a stable electrical connection to the IC 550.

Also, due to an operation of the display panel 510, heat may be generated by the IC 550 and the main circuit member 555. If the temperature of the IC 550 or the main circuit member 555 exceeds a certain threshold, electrical properties of the IC 550 and the main circuit member 555 may be degraded or electrical defects may occur. The heat generated by the IC 550 and the main circuit member 555 may be effectively emitted through the heat transfer particles 522 of the intermediate member 520, and thus the electrical properties of the IC 550 and the main circuit member 555 may be improved.

As shown in FIG. 12, the intermediate member 520 may be disposed such that the length of the intermediate member 520 along the Y direction is the same as the length of an end portion of the substrate 501 along the Y direction. Accordingly, the intermediate member 520 may correspond to a space between the substrate 501 and the covering member 590. The intermediate member 520 may prevent unintentional separation of the substrate 501 and the covering member 590.

As described above, according to the one or more of the above exemplary embodiments of the present invention, a display apparatus may have improved durability and electrical properties.

It should be understood that the exemplary embodiments described therein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A display apparatus comprising:
   a display panel;
   a covering member; and
   an intermediate member comprising a base material comprising an insulating material and a heat transfer particle, the intermediate member disposed between the display panel and the covering member,
   wherein:
   the display panel comprises:
      a substrate;
      an encapsulation member which faces the substrate; and
      a display device arranged between the substrate and the encapsulation member;
   the covering member is arranged to face the display panel;
   the intermediate member is disposed in a gap between the covering member and an area of the substrate where the encapsulation member is not disposed;
   the display apparatus further comprises:
      a touch pattern layer disposed on a surface of the substrate or the encapsulation member, the touch pattern layer comprising a touch pattern to recognize a touch input of a user; and
      a circuit member to transmit electrical signals to the touch pattern; and
   the intermediate member covers a first portion of the circuit member, the first portion of the circuit member being disposed in a gap between the substrate and the covering member.

2. The display apparatus of claim 1, wherein the intermediate member covers a second portion of the circuit member, the second portion of the circuit member being disposed in a gap between the substrate and the covering member where the encapsulation member is not disposed.

* * * * *